(12) United States Patent
Takenaka et al.

(10) Patent No.: US 10,644,204 B2
(45) Date of Patent: May 5, 2020

(54) LIGHT EMITTING ELEMENT INCLUDING CONTACT ELECTRODE WITH LAMINATE STRUCTURE, AND METHOD OF MANUFACTURING THE SAME

(71) Applicant: TOYODA GOSEI CO., LTD., Kiyosu-shi (JP)

(72) Inventors: Yasuhiro Takenaka, Kiyosu (JP); Yoshiki Saito, Kiyosu (JP); Shinichi Matsui, Kiyosu (JP); Daisuke Shinoda, Kiyosu (JP); Takashi Hodota, Chiba (JP); Hironao Shinohara, Chiba (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/705,135

(22) Filed: Sep. 14, 2017

(65) Prior Publication Data

US 2018/0083166 A1 Mar. 22, 2018

(30) Foreign Application Priority Data

Sep. 21, 2016 (JP) .................................. 2016-184867

(51) Int. Cl.
*H01L 33/40* (2010.01)
*H01L 33/38* (2010.01)
(Continued)

(52) U.S. Cl.
CPC ........ *H01L 33/405* (2013.01); *H01L 33/0075* (2013.01); *H01L 33/38* (2013.01);
(Continued)

(58) Field of Classification Search
CPC ... H01L 33/405; H01L 33/32; H01L 33/0075; H01L 33/38; H01L 33/0016
See application file for complete search history.

(56) References Cited

U.S. PATENT DOCUMENTS 8,461,617 B2 * 6/2013 Kadan ................... H01L 33/382
257/81
8,865,591 B2 10/2014 Tamari et al.
(Continued)

FOREIGN PATENT DOCUMENTS

CN 102132426 A 7/2011
CN 102687247 A 9/2012
(Continued)

OTHER PUBLICATIONS

Chinese Office Action dated Jan. 22, 2019, in Chinese Patent Application No. 201710755921.2 with an English translation.
(Continued)

*Primary Examiner* — Allen L Parker
*Assistant Examiner* — Gustavo G Ramallo
(74) *Attorney, Agent, or Firm* — McGinn IP Law Group, PLLC (57) ABSTRACT

A method of manufacturing a light emitting element includes forming an n-type semiconductor layer that includes an n-type clad layer and $Al_xGa_{1-x}N$ ($0.1 \leq x \leq 1$) as a main component, forming an n-side contact electrode that includes a laminate structure including a Ti layer and a Ru layer, the Ti layer being in contact with the n-type semiconductor layer, and forming an ohmic contact of the n-type semiconductor layer and the Ti layer by a heat treatment.

8 Claims, 5 Drawing Sheets

(51) Int. Cl.
*H01L 33/00* (2010.01)
*H01L 33/32* (2010.01)
*H01L 33/46* (2010.01)

(52) U.S. Cl.
CPC .......... *H01L 33/382* (2013.01); *H01L 33/007* (2013.01); *H01L 33/32* (2013.01); *H01L 33/46* (2013.01); *H01L 2933/0016* (2013.01)

(56) References Cited

U.S. PATENT DOCUMENTS

| | | | |
|---|---|---|---|
| 9,478,718 B2 | 10/2016 | Kim | |
| 2002/0045108 A1* | 4/2002 | Lee | G03F 1/24 430/5 |
| 2003/0025115 A1* | 2/2003 | Uemura | H01L 29/452 257/40 |
| 2003/0133656 A1* | 7/2003 | Baldwin | C03C 25/002 385/37 |
| 2003/0205714 A1* | 11/2003 | Sugawara | H01L 33/0079 257/89 |
| 2005/0225230 A1* | 10/2005 | Takeda | H01J 1/316 313/496 |
| 2006/0286800 A1* | 12/2006 | Dominguez | H01L 21/76826 438/680 |
| 2008/0296627 A1* | 12/2008 | Watanabe | H01L 21/6835 257/200 |
| 2011/0156065 A1* | 6/2011 | Kadan | H01L 33/382 257/88 |
| 2012/0258591 A1 | 10/2012 | Tamari et al. | |
| 2014/0054633 A1 | 2/2014 | Kim et al. | |
| 2014/0166974 A1* | 6/2014 | Yoo | H01L 33/08 257/13 |
| 2016/0155902 A1* | 6/2016 | Lunev | H01L 33/405 257/98 |
| 2017/0229626 A1* | 8/2017 | Yang | H01L 33/0079 |

FOREIGN PATENT DOCUMENTS

| | | |
|---|---|---|
| JP | 2011-151393 A | 8/2011 |
| JP | 5177227 B2 | 4/2013 |
| JP | 2014-045192 A | 3/2014 |
| JP | 2015-065280 A | 4/2015 |
| WO | WO 2011/077748 A1 | 6/2011 |
| WO | WO 2011/078252 A1 | 6/2011 |

OTHER PUBLICATIONS

Japanese Office Action dated Sep. 3, 2019, in Japanese Patent Application No. 2016-184867 with an English translation.

* cited by examiner

LIGHT EMITTING ELEMENT INCLUDING CONTACT ELECTRODE WITH LAMINATE STRUCTURE, AND METHOD OF MANUFACTURING THE SAME

The present application is based on Japanese patent application No. 2016-184867 filed on Sep. 21, 2016, the entire contents of which are incorporated herein by reference.

BACKGROUND OF THE INVENTION

1. Field of the Invention

This invention relates to a light emitting element and a method of manufacturing the light emitting element.

2. Description of the Related Art

A light emitting element is known in which a reflective electrode layer formed of Ru is formed on a p-type semiconductor layer of $Al_xGa_{1-x}N$ ($0 \leq x \leq 1$) (see e.g. JP-A-2011-151393).

The light emitting element disclosed by JP-A-2011-151393 can increase the amount of light emitted through a front surface thereof by efficiently reflecting, of light emitted from an emission layer whose emission wavelength is in the range of 200 to 495 nm, one emitted toward a back surface thereof.

Also, a light emitting element is known in which a pad electrode with a Ti/Ru/Au laminate structure is connected to a p-type semiconductor layer formed of a group III-V compound semiconductor (see e.g. JP-B-5177227).

SUMMARY OF THE INVENTION

In the light emitting element disclosed by JP-A-2011-151393, the reflective electrode layer formed of Ru is directly connected onto the p-type semiconductor layer. However, Ru has a high contact resistance with $Al_xGa_{1-x}N$ ($0 \leq x \leq 1$) compared to other electrode material such as Ti. This may cause an increase in forward voltage of the light emitting element.

If the light emitting element disclosed by JP-B-5177227 is an ultraviolet light emitting element, Al composition of the p-type semiconductor layer will be increased. Thus, the p-type semiconductor layer may not be in ohmic contact with a Ti film simply formed thereon. Since JP-B-5177227 does not teach any special treatment for forming the ohmic contact, the p-type semiconductor layer may not be in ohmic contact with the pad electrode with the Ti/Ru/Au laminate structure as long as the light emitting element disclosed by JP-B-5177227 is the ultraviolet light emitting element.

It is an object of the invention to provide a light emitting element that emits a ultraviolet light, has a low forward voltage due to a low contact resistance between an n-side electrode and an AlGaN layer of the emission layer, and has a high light extraction efficiency due to a high light reflection property of the n-side electrode, as well as a method of manufacturing the light emitting element.

According to an embodiment of the invention, provided are a method of manufacturing a light emitting element defined by [1] to [5] below and a light emitting element defined by [6] to [8] below.

[1] A method of manufacturing a light emitting element, comprising:
forming an n-type semiconductor layer that comprises an n-type clad layer and $Al_xGa_{1-x}N$ ($0.1 \leq x \leq 1$) as a main component;
forming an n-side contact electrode that comprises a laminate structure comprising a Ti layer and a Ru layer, the Ti layer being in contact with the n-type semiconductor layer; and
forming an ohmic contact of the n-type semiconductor layer with the Ti layer by a heat treatment.

[2] The method according to [1], wherein the n-type semiconductor layer comprises $Al_xGa_{1-x}N$ ($x \geq 0.65$) as the main component.

[3] The method according to [1] or [2], wherein a thickness of the Ti layer is not less than 0.5 nm and not more than 2.5 nm.

[4] The method according to any one of [1] to [3], wherein the Ti layer is formed by sputtering using an RF power source.

[5] The method according to any one of [1] to [4], wherein the Ru layer is formed by sputtering at a gas pressure of not more than 0.4 Pa.

[6] A light emitting element, comprising:
an n-type semiconductor layer that comprises an n-type clad layer and $Al_xGa_{1-x}N$ ($0.1 \leq x \leq 1$) as a main component; and
an n-side contact electrode that comprises a laminate structure comprising a Ti layer and a Ru layer, the Ti layer being in ohmic contact with the n-type semiconductor layer.

[7] The light emitting element according to [6], wherein the n-type semiconductor layer comprises $Al_xGa_{1-x}N$ ($x \geq 0.65$) as the main component.

[8] The light emitting element according to [6] or [7], wherein a thickness of the Ti layer is not less than 0.5 nm and not more than 2.5 nm.

Effects of the Invention

According to an embodiment of the invention, a light emitting element can be provided that emits a ultraviolet light, has a low forward voltage due to a low contact resistance between an n-side electrode and an AlGaN layer of an emission layer, and has a high light extraction efficiency due to a high light reflection property of the n-side electrode, as well as a method of manufacturing the light emitting element.

BRIEF DESCRIPTION OF THE DRAWINGS

Next, the present invention will be explained in conjunction with appended drawings, wherein.

DETAILED DESCRIPTION OF THE PREFERRED EMBODIMENTS

Embodiment

Figure 1:
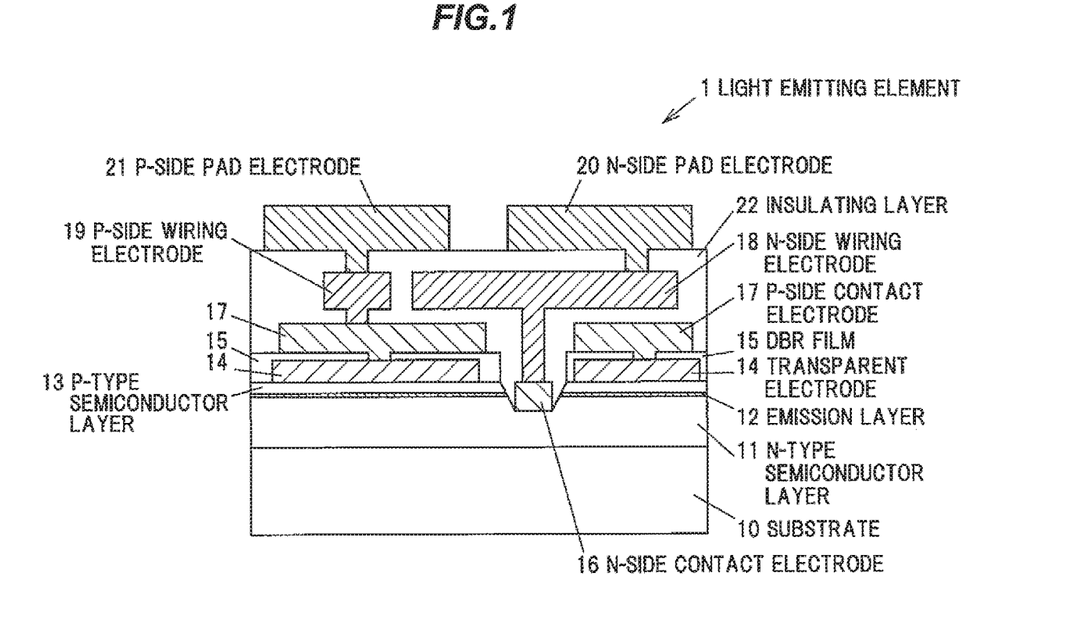
FIG. 1 is a cross sectional view showing a light emitting element according to the embodiment.

FIG. 1 is a cross sectional view showing a light emitting element 1 according to the embodiment. The light emitting element 1 comprises a substrate 10, an n-type semiconductor layer 11 on the substrate 10, an emission layer 12 on the n-type semiconductor layer 11, a p-type semiconductor layer 13 on the emission layer 12, a transparent electrode 14 on the p-type semiconductor layer 13, a distributed Bragg reflector (DBR) film 15 covering upper and side surfaces of the transparent electrode 14, an n-side contact electrode 16 connected to the n-type semiconductor layer 11, a p-side contact electrode 17 formed on the DBR film 15, connected to the p-side semiconductor layer 13, an n-side wiring electrode 18 connected to the n-side contact electrode 16, a p-side wiring electrode 19 connected to the p-side contact electrode 17, an n-side pad electrode 20 connected to the n-side wiring electrode 18, and a p-side pad electrode 21 connected to the p-side wiring electrode 19.

Moreover, the emission layer 12, the p-type semiconductor layer 13, the transparent electrode 14, the DBR film 15, the n-side contact electrode 16, the p-side contact electrode 17, the n-side wiring electrode 18, and the p-side wiring electrode 19 are included in an insulating layer 22. The n-side pad electrode 20 and the p-side pad electrode 21 are formed so as to be exposed on the insulating layer 22.

The substrate 10 is a layer so as to be a base of growing the n-type semiconductor layer 11. For example, the substrate 10 is made of materials such as sapphire, SiC, ZnO, Si, GaN, and AlN.

The n-type semiconductor layer 11 is a layer whose main component is AlGaN. For example, Si is used as a donor included in the n-type semiconductor layer 11.

AlGaN that configures the n-type semiconductor layer 11 has a composition such that the n-type semiconductor layer 11 fails to absorb light emitted from the emission layer 12. Especially, the band gap in AlGaN increases according as the Al composition increases. Thus, absorbing shorter wavelength light in the n-type semiconductor layer 11 can be controlled.

For example, the composition of the n-type semiconductor layer 11 is $Al_xGa_{1-x}N$ ($0.1 \leq x < 0.4$) when an emission wavelength of the emission layer 12 is within the wavelength band called the UV-A (315 to 400 nm).

The composition of the n-type semiconductor layer 11 is $Al_xGa_{1-x}N$ ($0.4 \leq x < 0.65$) when the emission wavelength of the emission layer 12 is within the wavelength band called the UV-B (280 to 315 nm).

The composition of the n-type semiconductor layer 11 is $Al_xGa_{1-x}N$ ($0.65 \leq x \leq 1$) when the emission wavelength of the emission layer 12 is within the wavelength band called the UV-C (less than 280 nm).

For example, the n-type semiconductor layer 11 comprises an n-side contact layer to which the n-side contact electrode 16 is connected, and an n-side clad layer that contacts with the emission layer 12. Meanwhile, a buffer layer may be arranged between the substrate 10 and the n-type semiconductor layer 11.

The emission layer 12 emits by recombining an electron and a positive hole. The emission layer 12 comprises a wall layer and a blocking layer. For example, the AlGaN layer can be used as the wall layer. For example, the AlGaN layer whose band gap is larger than the AlGaN layer for the wall layer can be used as the blocking layer. Composition ratio between these layers is suitably selected corresponding to the emission wavelength of the emission layer 12.

For example, the p-type semiconductor layer 13 is a layer whose main component is AlGaN. For example, Mg is used as an acceptor included in the p-type semiconductor layer 13. The composition ratio of AlGaN configuring the p-type semiconductor layer 13 is suitably selected corresponding to the emission wavelength of the emission layer 12.

For example, the p-type semiconductor layer 13 comprises a p-side clad layer that contacts with the emission layer 12, and a p-side contact layer that is connected to the transparent electrode 14.

The transparent electrode 14 is an electrode layer that is electrically connected to the p-type semiconductor layer 13 and pass through the light. The transparent electrode 14 is made of a transparent material such as Indium Zinc Oxide (IZO). For example, the thickness of the transparent electrode 14 is 100 nm.

For example, the DBR film 15 is a multilayer film of $SiO_2$ and $Nb_2O_5$. The DBR film 15 reflects the light emitted from the emission layer 12 for a substrate 10 side (an emission side).

The n-side contact electrode 16 comprises a laminate structure of a Ti layer that is in ohmic contact with the n-type semiconductor layer 11 and a Ru layer that reflects the light emitted from the emission layer 12 for the substrate 10 side.

Further, the n-side contact electrode 16 may comprise other layers such as an Au layer on the Ru layer. In such case, the n-side contact electrode 16 comprises a Ti/Ru/Au laminate structure or a Ti/Ru/Au/Al laminate structure. The Ru layer performs as a diffusion prevention layer that prevents Ti and Au from diffusing.

In contacting the Ti layer with the AlGaN layer, when the Al composition in the AlGaN layer is low, the ohmic contact is formed by laminating the Ti layer on the AlGaN layer. Meanwhile, when the Al composition in the AlGaN layer is high, the ohmic contact fails to be formed by only forming the Ti layer on the AlGaN layer. Heat treatment (annealing) is needed. Moreover, thermal temperature so as to form the ohmic contact increases as the Al composition in the AlGaN increases.

Since the n-type semiconductor layer 11 in the light emitting element 1 that emits ultraviolet radiation is configured from AlGaN whose Al composition is high, the heat treatment at not less than 300° C. is processed after forming the n-side contact electrode 16 so as to bring the n-side contact electrode 16 with the Ti layer as the bottom layer into ohmic contact with the n-type semiconductor layer 11.

For example, if the composition of the n-type semiconductor layer 11 is $Al_xGa_{1-x}N$ ($0.1 \leq x < 0.4$) for the UV-A light emitting element, the heat treatment at about 300° C. is needed such that the n-side contact electrode 16 is in ohmic contact with the n-type semiconductor layer 11. If the composition of the n-type semiconductor layer 11 is $Al_xGa_{1-x}N$ ($0.4 \leq x < 0.65$) for the UV-B light emitting element, the heat treatment at about 500° C. to 700° C., preferably 700° C., is needed. If the composition of the n-type semiconductor layer 11 is $Al_xGa_{1-x}N$ (0.65≤x≤1) for the UV-C light emitting element, the heat treatment at about 800° C. to 900° C., preferably 900° C., is needed.

The thickness of the Ti layer of the n-side contact electrode 16 is preferable to be not less than 0.5 nm and not more than 2.5 nm so as to decrease a forward voltage $V_F$ of the light emitting element 1 after the heat treatment, and decrease contact resistance between the n-side contact electrode 16 and the n-type semiconductor layer 11 after the heat treatment.

Furthermore, it is preferable to form the Ti layer of the n-side contact electrode 16 by sputtering using a radio frequency (RF) power source so as to keep surface condition of the n-side contact electrode 16 after the heat treatment well.

The Ru layer of the n-side contact electrode 16 has not only high reflectance to the ultraviolet radiation, but also excellent heat resistivity. Thus, the function of the Ru layer as the reflection layer or the diffusion prevention layer decreases very little if the heat treatment is made so as to bring the Ti layer into ohmic contact with the n-type semiconductor layer 11. Meanwhile, if the layer made of Pt or Rh are used instead of the Ru layer, the function as the reflection layer or the diffusion prevention layer decreases by the heat treatment so as to bring the Ti layer into ohmic contact with the n-type semiconductor layer 11.

It is preferable to form the Ru layer of the n-side contact electrode 16 by sputtering under the gas pressure of not more than 0.4 Pa so as to increase the reflectance of the Ru layer of the n-side contact electrode 16.

Further, the reflectance may decrease when the thickness of the Ru layer of the n-side contact electrode 16 is not more than 40 nm. Thus, the thickness of the Ru layer of the n-side contact electrode 16 is preferable to be more than 40 nm.

For example, the thicknesses of the Au layer and the Al layer are respectively 500 nm and 3.5 nm when the n-side contact electrode 16 comprises the Au layer and the Al layer on the Ru layer.

For example, the p-side contact electrode 17 comprises the same laminate structure as the n-side contact electrode 16. In such case, the p-side contact electrode 17 can be formed with the n-side contact electrode 16.

It is preferable to form the Ti layer of the p-side contact electrode 17 by sputtering under the gas pressure of not more than 0.5 Pa so as to increase adhesive force of the p-side contact electrode 17 to the DBR film 15. Meanwhile, as described above, when the p-side contact electrode 17 comprises the same laminate structure as the n-side contact electrode 16, and the p-side contact electrode 17 can be formed with the n-side contact electrode 16, it is preferable to form the Ti layer of the n-side contact electrode 16 and the Ti layer of the p-side contact electrode 17 by sputtering under the gas pressure of not more than 0.5 Pa so as to increase the adhesive force of the p-side contact electrode 17 to the DBR film 15.

For example, the n-side wiring electrode 18 and the p-side wiring electrode 19 have the Ti/Ru/Au/Al laminate structures. In such case, for example, the thicknesses of the Ti layer, the Ru layer, the Au layer, and the Al layer are respectively 1.5 nm, 100 nm, 500 nm, 3.5 nm.

For example, the n-side pad electrode 20 and the p-side pad electrode 21 have the Ti/Ru/Au laminate structures. In such case, for example, the thicknesses of the Ti layer, the Ru layer, and the Au layer are respectively 1.5 nm, 100 nm, 500 nm.

Meanwhile, it is not preferable to use the layers made of Pt or Rh instead of the Ru layer when the p-side contact electrode 17, the n-side wiring electrode 18, the p-side wiring electrode 19, the n-side pad electrode 20, and the p-side pad electrode 21 are formed before the heat treatment to bring the Ti layer of the n-side contact electrode 16 into ohmic contact with the n-type semiconductor layer 11. As described above, Pt and Rh reduces these properties caused by the temperature in the heat treatment to bring the Ti layer of the n-side contact electrode 16 into ohmic contact with the n-type semiconductor layer 11.

The light emitting element 1 may be a glass sealed element. In such case, it is not preferable to use the layers made of Pt, Rh to the p-side contact electrode 17, the n-side wiring electrode 18, the p-side wiring electrode 19, the n-side pad electrode 20, and the p-side pad electrode 21 instead of the Ru layer since glass sealing process needs to heat at temperature more than 500° C. For example, the light emitting element 1 can be sealed directly by glass whose deformation point (or melting point) is about 500° C. since the light emitting element 1 can withstand high temperature not less than 500° C.

The insulating layer 22 is made of an insulating material such as $SiO_2$.

EXAMPLES

A test in the light emitting element 1 according to the above embodiment is processed. Preferable values to various parameters are calculated.

(Ti Film Thickness)

Tables 1 to 3 described below show the relation between a film thickness of the Ti layer of the n-side contact electrode 16 and the forward voltage $V_F$ of the light emitting element 1. Table 1 shows the forward voltage $V_F$ before the heat treatment after forming the n-side contact electrode 16. Table 2 shows the forward voltage $V_F$ after the heat treatment at 315° C. Table 3 shows the forward voltage $V_F$ after the heat treatment at 575° C.

TABLE 1

Before the heat treatment

| | | Ti film thickness (nm) | | | | | | |
|---|---|---|---|---|---|---|---|---|
| | | 0.5 | 1 | 1.5 | 2 | 2.5 | 3 | 3.5 | 4 |
| Forward voltage $V_F$ | 1 µA | 2.57 | 2.57 | 2.49 | 2.52 | 2.54 | 2.55 | 2.45 | 2.48 |
| | 10 µA | 2.69 | 2.69 | 2.60 | 2.65 | 2.66 | 2.68 | 2.64 | 2.63 |
| | 1 mA | 2.97 | 2.96 | 2.85 | 2.91 | 2.94 | 3.00 | 2.90 | 2.88 |
| | 20 mA | 3.32 | 3.16 | 3.00 | 3.13 | 3.30 | 3.56 | 3.11 | 3.11 |
| | 100 mA | 3.85 | 3.41 | 3.25 | 3.50 | 3.80 | 4.10 | 3.47 | 3.51 |
| | 200 mA | 4.16 | 3.58 | 3.46 | 3.75 | 4.06 | 4.41 | 3.72 | 3.80 |
| | 350 mA | 4.45 | 3.76 | 3.67 | 4.00 | 4.31 | 4.65 | 3.98 | 4.05 |
| | 500 mA | 4.63 | 3.90 | 3.83 | 4.16 | 4.50 | 4.80 | 4.12 | 4.21 |

TABLE 2

After the heat treatment (315° C.)

| | | Ti film thickness (nm) | | | | | | |
|---|---|---|---|---|---|---|---|---|
| | | 0.5 | 1 | 1.5 | 2 | 2.5 | 3 | 3.5 | 4 |
| Forward voltage $V_F$ | 1 µA | 2.56 | 2.56 | 2.55 | 2.56 | 2.57 | 2.57 | 2.52 | 2.57 |
| | 10 µA | 2.68 | 2.67 | 2.66 | 2.68 | 2.68 | 2.69 | 2.63 | 2.68 |
| | 1 mA | 2.95 | 2.96 | 2.91 | 2.93 | 2.94 | 2.95 | 2.90 | 2.93 |
| | 20 mA | 3.24 | 2.34 | 3.10 | 3.11 | 3.19 | 3.48 | 3.71 | 3.26 |
| | 100 mA | 3.60 | 3.60 | 3.31 | 3.32 | 3.66 | 4.34 | 4.79 | 4.02 |

TABLE 2-continued

After the heat treatment (315° C.)

| | Ti film thickness (nm) | | | | | | | |
|---|---|---|---|---|---|---|---|---|
| | 0.5 | 1 | 1.5 | 2 | 2.5 | 3 | 3.5 | 4 |
| 200 mA | 3.82 | 3.71 | 3.45 | 3.46 | 4.00 | 4.82 | 5.37 | 4.53 |
| 350 mA | 4.05 | 3.85 | 3.60 | 3.63 | 4.33 | 5.20 | 5.82 | 4.96 |
| 500 mA | 4.20 | 3.95 | 3.72 | 3.76 | 4.50 | 5.34 | 6.06 | 5.25 |

TABLE 3

After the heat treatment (575° C.)

| | | Ti film thickness (nm) | | | | | | | |
|---|---|---|---|---|---|---|---|---|---|
| | | 0.5 | 1 | 1.5 | 2 | 2.5 | 3 | 3.5 | 4 |
| For- | 1 µA | 2.55 | 2.56 | 2.55 | 2.56 | 2.57 | 2.57 | 2.55 | 2.57 |
| ward | 10 µA | 2.67 | 2.67 | 2.66 | 2.67 | 2.69 | 2.69 | 2.66 | 2.69 |
| volt- | 1 mA | 2.92 | 2.93 | 2.91 | 2.93 | 2.94 | 2.94 | 2.90 | 2.93 |
| age | 20 mA | 3.12 | 3.15 | 3.08 | 3.10 | 3.13 | 3.18 | 3.12 | 3.20 |
| $V_F$ | 100 mA | 3.38 | 3.37 | 3.34 | 3.30 | 3.37 | 3.57 | 3.51 | 3.70 |
| | 200 mA | 3.60 | 3.48 | 3.40 | 3.46 | 3.55 | 3.97 | 3.87 | 4.19 |
| | 350 mA | 3.75 | 3.87 | 3.65 | 3.66 | 3.81 | 4.45 | 4.31 | 4.64 |
| | 500 mA | 4.00 | 4.09 | 3.80 | 3.80 | 4.02 | 4.83 | 4.60 | 5.02 |

Figure 2A:
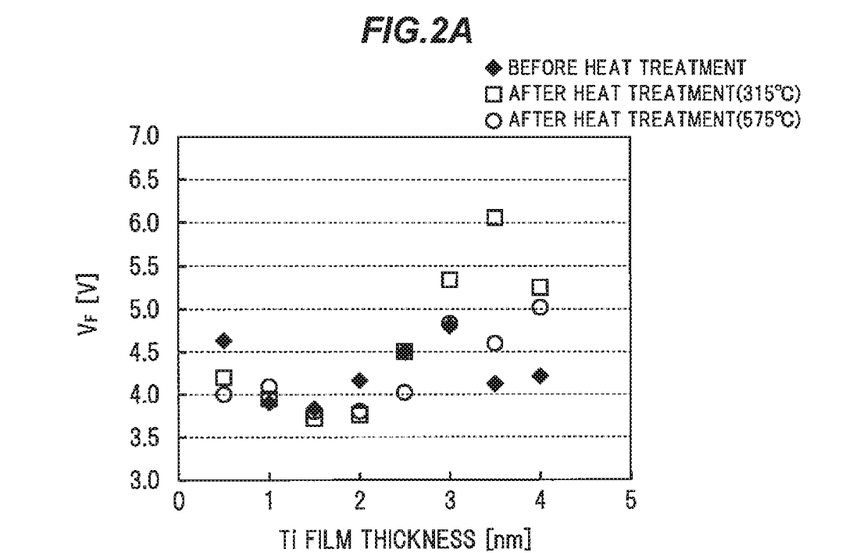
FIG. 2A is a graph showing the relation between a film thickness of Ti layer and forward voltage $V_F$ in flowing current of 500 mA to the light emitting element.

FIG. 2A is a graph showing the relation between the film thickness of the Ti layer and the forward voltage $V_F$ in flowing current of 500 mA to the light emitting element 1.

As a result shown in Tables 1 to 3 and FIG. 2A, the forward voltage $V_F$ of the light emitting element 1 in processing the heat treatment after forming the n-side contact electrode 16 can decrease by setting the film thickness of the Ti layer of the n-side contact electrode 16 at not more than 2.5 nm.

The film thickness of the Ti layer is preferable to be not less than 0.5 nm since the forward voltage $V_F$ of the light emitting element 1 may increase while the Ti layer is thinner than 0.5 nm.

Next, Table 4 shows the relation between the film thickness of the Ti layer of the n-side contact electrode 16 and an n-side contact resistance in the light emitting element 1. The n-side contact resistance means the contact resistance between the n-side contact electrode 16 and the n-type semiconductor layer 11.

TABLE 4

| | | n-side contact resistance (Ω) | | |
|---|---|---|---|---|
| | | Before the heat treatment | After the heat treatment (315° C.) | After the heat treatment (575° C.) |
| Ti film | 0.50 | 0.0015 | 0.0006 | 0.0005 |
| thickness (nm) | 1.00 | 0.0005 | 0.0004 | 0.0004 |
| | 1.50 | 0.0007 | 0.0004 | 0.0004 |
| | 2.00 | 0.0008 | 0.0005 | 0.0004 |
| | 2.50 | 0.0009 | 0.0012 | 0.0005 |
| | 3.00 | 0.0012 | 0.0016 | 0.0008 |
| | 3.50 | 0.0010 | 0.0032 | 0.0007 |
| | 4.00 | 0.0009 | 0.0016 | 0.0009 |

Figure 2B:
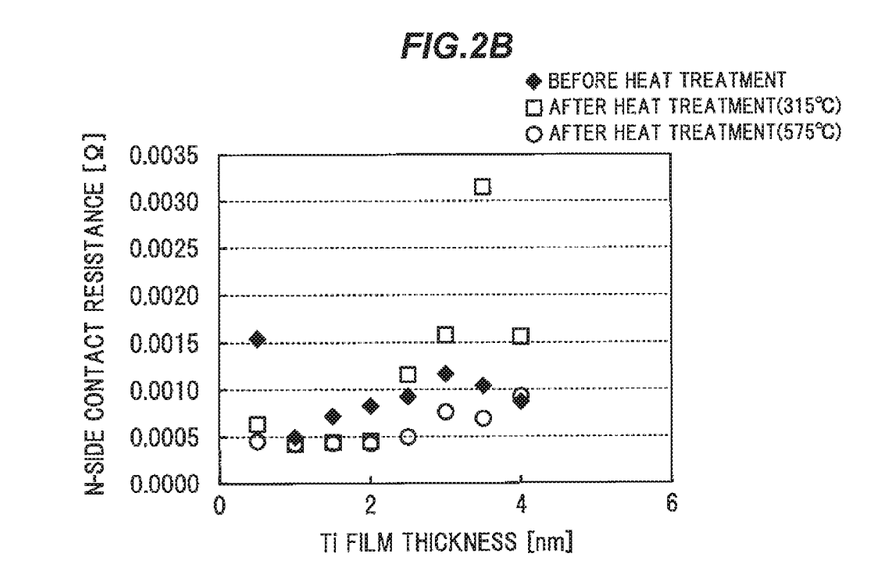
FIG. 2B is a graph showing the relation between the film thickness of the Ti layer described and an n-side contact resistance in Table 4.

FIG. 2B is a graph showing the relation between the film thickness of the Ti layer and the n-side contact resistance in Table 4.

As a result shown in Table 4 and FIG. 2B, the n-side contact resistance of the light emitting element 1 in processing the heat treatment after forming the n-side contact electrode 16 can decrease by setting the film thickness of the Ti layer of the n-side contact electrode 16 at not more than 2.5 nm.

The film thickness of the Ti layer is preferable to be not less than 0.5 nm since the n-side contact resistance of the light emitting element 1 may increase while the Ti layer is thinner than 0.5 nm.

Meanwhile, although this test is processed to the light emitting element 1 whose Al composition in the n-type semiconductor layer 11 is "x=0.1", and whose emission wavelength band is within the UV-A, heat treatment temperature needed to change n-side contact into ohmic contact increases when the same test is processed to the light emitting element 1 whose Al composition in the n-type semiconductor layer 11 is higher, and whose emission wavelength band is within the UV-B, or the UV-C. Therefore, the n-side contact resistance before the heat treatment and the n-side contact resistance after the heat treatment at 315° C. increase.

(Ti Film Formation Condition)

Figure 3A:
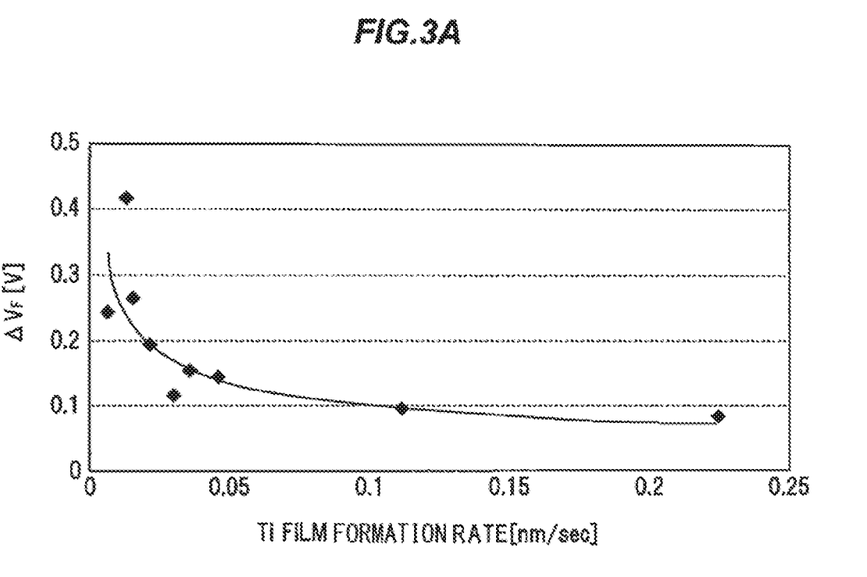
FIG. 3A is a graph showing the relation between a film formation rate of the Ti layer of an n-side contact electrode and the forward voltage difference $\Delta V_F$ of the light emitting element between before and after heat treatment.

FIG. 3A is a graph showing the relation between a film formation rate of the Ti layer of the n-side contact electrode 16 and the forward voltage difference $\Delta V_F$ of the light emitting element 1 between before and after the heat treatment. $\Delta V_F$ means the difference between the forward voltage $V_F$ before the heat treatment and the forward voltage $V_F$ after the heat treatment at 575° C.

In this test, $\Delta V_F$ is calculated by measuring the forward voltage $V_F$ of flowing the current of 500 mA in the light emitting element 1 under the film thickness of the Ti layer of the n-side contact electrode 16 at 2 nm.

FIG. 3A shows that an increment of the $V_F$ caused by the heat treatment increases as the film formation rate of the Ti layer decreases. Thus, it is preferable to increase the film formation rate of the Ti layer certainly so as to decrease the forward voltage $V_F$ of the light emitting element 1 after the heat treatment. For example, the film formation rate of the Ti layer is preferable to be not less than 0.1 nm/sec.

Figure 3B:
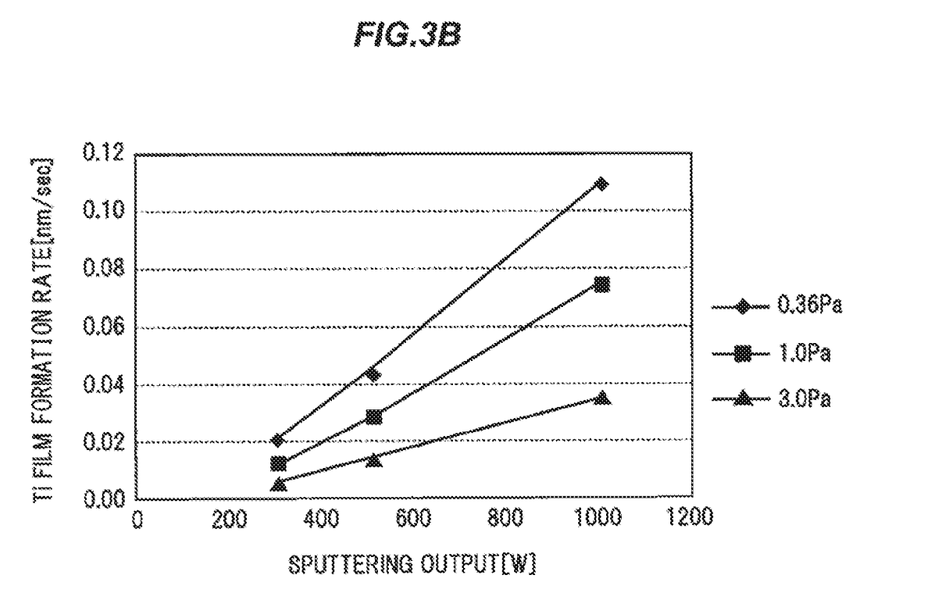
FIG. 3B is a graph showing the relation between the film formation rate of the Ti layer and sputtering output.

FIG. 3B is a graph showing the relation between the film formation rate of the Ti layer and sputtering output. Since the film formation rate of the Ti layer increases linearly corresponding to increment of the sputtering output, the film formation rate can be controlled by sputtering output.

Figure 4:
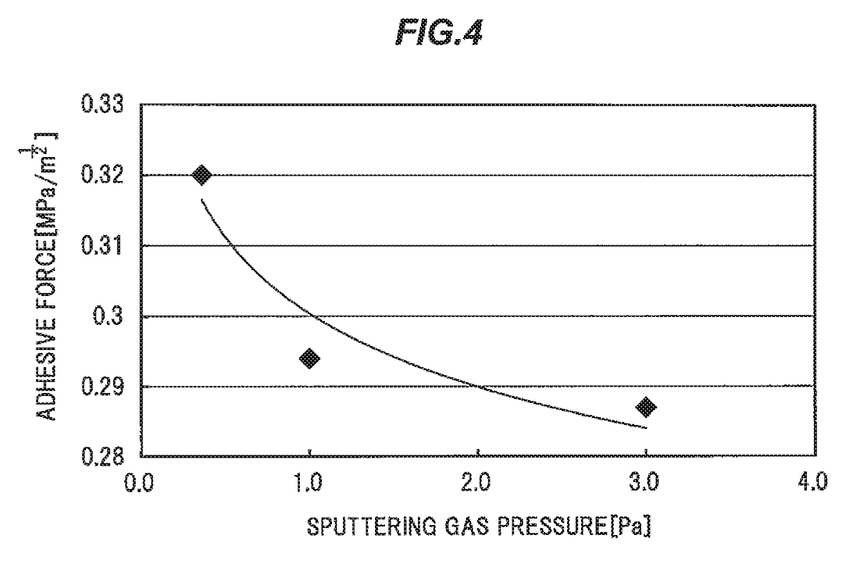
FIG. 4 is a graph showing the relation between the adhesion of the Ti film and sputtering gas pressure.

FIG. 4 is a graph showing the relation between adhesion of the Ti film and sputtering gas pressure. The adhesion of the Ti film is measured by processing the modified edge lift off test (mELT) to the Ti/Ru/Au/Al laminate film deposited on SiO₂ substrate. The mELT is to peel off the film using sheering stress caused by the difference in thermal shrinkage rate between epoxy resin coated on the film and the substrate.

FIG. 4 shows that the adhesive force of the Ti film increases as the sputtering gas pressure decreases. For the light emitting element 1, as an example, the adhesive force of the Ti layer of the p-side contact electrode 17 to the DBR film 15 whose surface is the SiO₂ layer is preferable to be not less than 0.307 MPa*m1/2. In such case, the sputtering gas pressure in depositing the Ti layer is preferable to be not more than about 0.5 Pa. If the p-side contact electrode 17 comprises the same structure as the n-side contact electrode 16 and is formed with the n-side contact electrode 16, the sputtering gas pressure in depositing the Ti layer of the n-side contact electrode 16 is also preferable to be not more than about 0.5 Pa.

The inventors have found that a bulge sometimes causes on the surface of the n-side contact electrode 16 after the heat treatment when the direct current (DC) power source is used in sputtering the Ti layer. Meanwhile, when the radio frequency (RF) power source is used in sputtering, such bulge fails to cause on the surface of the n-side contact electrode 16. It is preferable to use the RF power source in sputtering the Ti layer (for example, the wavelength is 13.56 MHz) since the bulge on the surface of the n-side contact electrode 16 causes adverse effect in the reflectance and so on.

(Ru Film Formation Condition)

Next, Table 5 shows the relation in the Ru layer of the n-side contact electrode 16 between the reflectance and the sputtering condition. "Gas pressure", "Output", and "T-S distance" in Table 5 respectively mean "the sputtering gas pressure", "the sputtering output", and "distance between target and the substrate".

TABLE 5

| Gas pressure (Pa) | 0.03 | 0.05 | 0.07 | 0.1 | 0.3 | 0.5 | 1 |
|---|---|---|---|---|---|---|---|
| Output (W) | 1000 | 1000 | 1000 | 1000 | 1000 | 1000 | 1000 |
| T-S distance (mm) | 150 | 150 | 150 | 150 | 150 | 150 | 150 |
| Reflectance | 56.5% | 56.3% | 56.2% | 56.4% | 55.3% | 49.5% | 36.1% |

Figure 5:
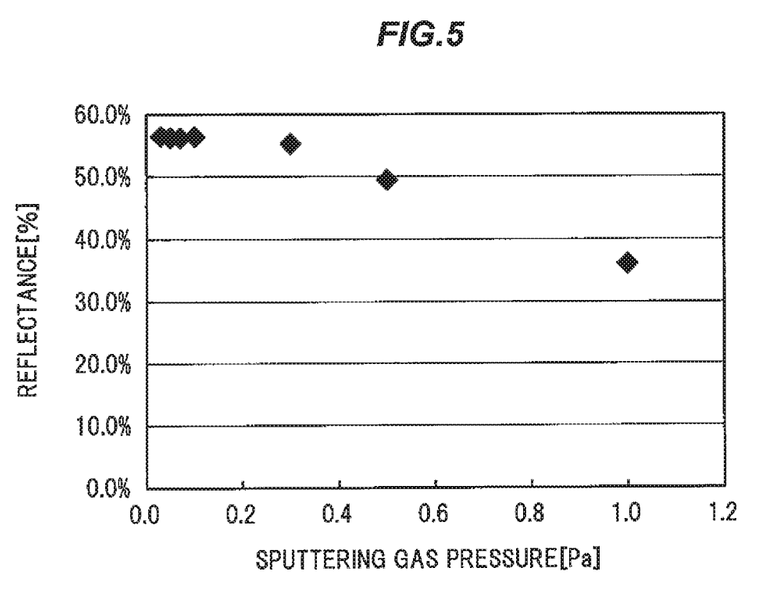
FIG. 5 is a graph showing reflectance of a Ru layer described in Table 5 and the sputtering gas pressure in Table 5.

FIG. 5 is a graph showing the reflectance of the Ru layer and the sputtering gas pressure shown in Table 5.

Table 5 and FIG. 5 show that the reflectance of the Ru layer increases as the sputtering gas pressure decreases. The sputtering gas pressure in depositing the Ru layer is preferable to be not more than about 0.4 Pa so as to increase the reflectance of the Ru layer of the n-side contact electrode 16.

(Ru Reflectance)

Figure 6A:
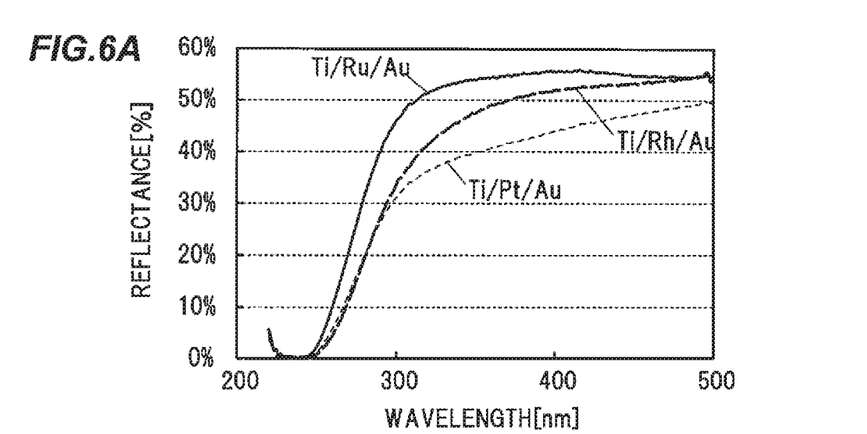
FIG. 6A is a graph comparing reflectance between the Ru layer, a Pt layer, and a Rh layer.

FIG. 6A is a graph comparing the reflectance between the Ru layer, the Pt layer, and the Rh layer. FIG. 6A shows the reflectance of the Ti/Ru/Au laminate film, the Ti/Pt/Au laminate film, and the Ti/Rh/Au laminate film. The film thickness of the Ti layer of each laminate film is 2 nm. The film thickness of the Au layer of each laminate film is 500 nm. The film thickness of each Ru, Pt, Rh layer of each laminate film is 100 nm.

FIG. 6A shows that the reflectance of the Pt layer and the Rh layer decreases as the light wavelength is shorter. Meanwhile, FIG. 6A shows that the Ru layer keeps high reflectance not less than about 300 nm. Thus, the Ru layer is better than the Pt layer and the Rh layer as the reflector used for the light emitting element emitting the ultraviolet radiation.

Figure 6B:
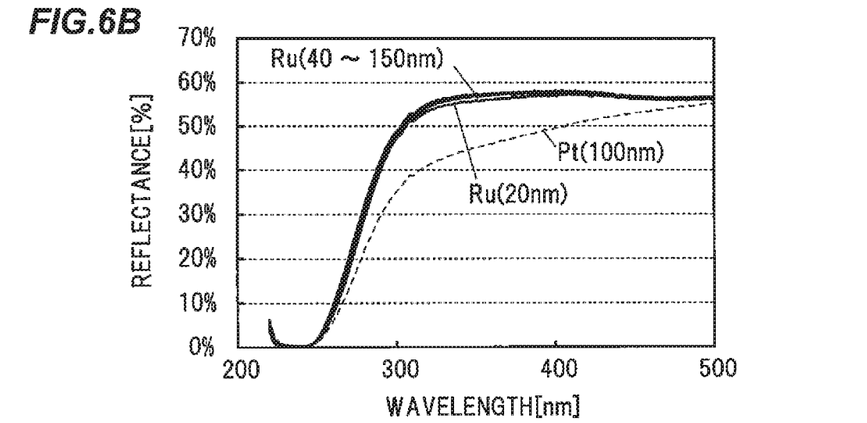
FIG. 6B is a graph showing the relation between the Ru film thickness and the reflectance.

FIG. 6B is a graph showing the relation between the film thickness of the Ru layer and the reflectance. FIG. 6B shows the reflectance of the Ru layers whose film thicknesses are respectively 20, 40, 60, 80, 100, and 150 nm. FIG. 6B shows the reflectance of the Pt layer whose film thickness is 100 nm as a comparative example.

FIG. 6B shows that the Ru layer keeps high reflectance from high wavelength to about 300 nm, and the high reflectance mostly fails to depend on the film thickness. Meanwhile, the reflectance of the Pt layer decreases as the light wavelength decreases.

Figure 6C:
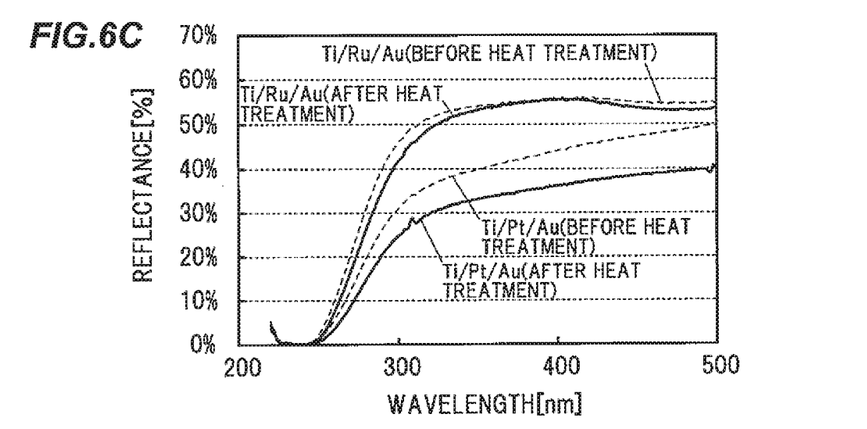
FIG. 6C is a graph showing reflectance change of the Ru layer and the Pt layer between before and after the heat treatment.

FIG. 6C is a graph showing reflectance change in the Ru layer and the Pt layer between before and after the heat treatment. FIG. 6C shows the reflectance of the Ti/Ru/Au laminate film, and the Ti/Pt/Au laminate film before and after the heat treatment at 575° C. The film thickness of the Ti layer of each laminate film is 2 nm. The film thickness of the Au layer of each laminate film is 500 nm. The film thicknesses of the Ru layer and the Pt layer of each laminate film are 100 nm.

FIG. 6C shows that although the reflectance of the Pt layer remarkably decrease caused by the heat treatment, the reflectance of the Ru layer substantially maintains.

Although, the embodiments of the invention have been described, the invention is not to be limited to the above embodiments and examples. The various kinds of modifications can be implemented without departing from the gist of the invention. For example, the structure of the light emitting element is not limited while the structure includes the n-type semiconductor layer 11, the n-side contact electrode 16, and the emission layer 12 emitting the ultraviolet radiation.

Although the embodiments have been described, the invention is not intended to be limited to the embodiments. It should be noted that all combinations of the features described in the embodiments are not necessary to solve the problem of the invention.

What is claimed is:

1. A method of manufacturing a light emitting element, comprising:
    forming an n-type semiconductor layer on a substrate, the n-type semiconductor layer comprising an n-type clad layer and $Al_xGa_{1-x}N$ ($0.1 \leq x \leq 1$) as a main component;
    forming an emission layer on the n-type semiconductor layer;
    forming an n-side contact electrode that comprises a laminate structure, the forming of the n-side contact electrode comprising:
        forming a Ti layer in contact with the n-type semiconductor layer, a film formation rate of the Ti layer being not less than 0.1 nm/sec and the Ti layer being formed by sputtering using an RF power source; and
        forming a Ru layer on the Ti layer for reflecting light emitted from the emission layer toward the substrate;
    after the forming of the Ru layer, forming an ohmic contact of the n-type semiconductor layer and the Ti layer by a heat treatment, the heat treatment being conducted at a temperature of not less than 300° C. and a reflectance of the Ru layer before the heat treatment being substantially the same as a reflectance of the Ru layer after the heat treatment; and
    after the heat treatment, glass-sealing the light emitting element at a temperature of not less than 500° C.

2. The method according to claim 1, wherein the-Ru layer is configured to prevent Ti of the Ti layer from diffusing in the light emitting element.

3. The method according to claim 1, wherein light emitted from the emission layer comprises an ultraviolet light.

4. The method according to claim 1, wherein the n-type semiconductor layer comprises $Al_xGa_{1-x}N$ ($x \geq 0.65$) as the main component.

5. The method according to claim 1, wherein a thickness of the Ti layer is not less than 0.5 nm and not more than 2.5 nm.

6. The method according to claim 1, wherein the Ru layer is formed by sputtering.

7. The method according to claim 1, wherein the Ru layer is formed by sputtering at a gas pressure of not more than 0.4 Pa.

8. A method of manufacturing a light emitting element, comprising:

forming an n-type semiconductor layer on a substrate, the n-type semiconductor layer comprising an n-type clad layer and $Al_xGa_{1-x}N$ ($0.1 \leq x \leq 1$) as a main component;

forming an emission layer on the n-type semiconductor layer, the emission layer emitting an ultraviolet light;

forming an n-side contact electrode that has a laminate structure, the forming of the n-side contact electrode comprising:

forming a Ti layer in contact with the n-type semiconductor layer, a film formation rate of the Ti layer being not less than 0.1 nm/sec and the Ti layer being formed by sputtering using an RF power source; and forming a Ru layer on the Ti layer by sputtering at a gas pressure of not more than 0.4 Pa and reflecting light emitted from the emission layer toward the substrate;

after the forming of the Ru layer, forming an ohmic contact of the n-type semiconductor layer and the Ti layer by a heat treatment, the heat treatment being conducted at a temperature of not less than 300° C. and a reflectance of the Ru layer before the heat treatment being substantially the same as a reflectance of the Ru layer after the heat treatment;

forming a p-type semiconductor layer on the emission layer, the p-type semiconductor layer including AlGaN as a main component; and forming a transparent electrode on the p-type semiconductor layer.

\* \* \* \* \*